United States Patent
Park et al.

(10) Patent No.: US 11,467,631 B2
(45) Date of Patent: Oct. 11, 2022

(54) DISPLAY DEVICE

(71) Applicant: Samsung Display Co., LTD., Yongin-si (KR)

(72) Inventors: In Soo Park, Hwaseong-si (KR); Se Yong Kim, Asan-si (KR)

(73) Assignee: Samsung Display Co., LTD., Yongin-si (KR)

( * ) Notice: Subject to any disclaimer, the term of this patent is extended or adjusted under 35 U.S.C. 154(b) by 43 days.

(21) Appl. No.: 17/082,007

(22) Filed: Oct. 28, 2020

(65) Prior Publication Data
US 2021/0216105 A1    Jul. 15, 2021

(30) Foreign Application Priority Data

Jan. 13, 2020   (KR) .................. 10-2020-0004019

(51) Int. Cl.
  *G06F 1/16*    (2006.01)
  *H01L 51/00*   (2006.01)
  *H01L 51/56*   (2006.01)

(52) U.S. Cl.
  CPC .......... *G06F 1/1652* (2013.01); *G06F 1/1681* (2013.01); *H01L 51/0097* (2013.01); *H01L 51/56* (2013.01)

(58) Field of Classification Search
  CPC .... G06F 1/1681; G06F 1/1652; G06F 1/1616; G06F 1/1641; G06F 2203/04102; G06F 1/1618; G06F 1/1626; G06F 1/1656; G06F 1/1679; G06F 1/16; G06F 1/203; G06F 1/206; G06F 3/0412
  See application file for complete search history.

(56) References Cited

U.S. PATENT DOCUMENTS

| | | | |
|---|---|---|---|
| 10,423,019 B1 | 9/2019 | Song | |
| 11,016,541 B2 * | 5/2021 | Lin | E05D 3/122 |
| 11,073,863 B2 * | 7/2021 | Kim | G06F 1/1652 |
| 2019/0166703 A1 | 5/2019 | Kim et al. | |
| 2020/0183464 A1 * | 6/2020 | Lin | G06F 1/1616 |
| 2020/0409427 A1 * | 12/2020 | Hsu | G06F 1/1641 |
| 2021/0034117 A1 * | 2/2021 | Torres | E05D 3/06 |
| 2021/0055763 A1 * | 2/2021 | Park | G06F 1/1652 |
| 2021/0318723 A1 * | 10/2021 | Cheng | G06F 1/1618 |

FOREIGN PATENT DOCUMENTS

KR    10-2019-0082357    7/2019

OTHER PUBLICATIONS

Extended European Search Report dated Jun. 16, 2021, issued in European Patent Application No. 21151275.1.

* cited by examiner

*Primary Examiner* — Abhishek M Rathod
(74) *Attorney, Agent, or Firm* — H.C. Park & Associates, PLC

(57) ABSTRACT

A display device includes a display panel, a first metal member, a hinge member, and a first blocking member. The display panel includes a foldable area. The first metal member is disposed in a first portion on a bottom surface of the display panel. The hinge member overlaps the foldable area on a bottom surface of the first metal member, and includes a first curved portion having a first curvature. The first blocking member is disposed between the bottom surface of the first metal member and the first curved portion of the hinge member, and includes a first surface having the first curvature.

17 Claims, 9 Drawing Sheets

DISPLAY DEVICE

CROSS-REFERENCE TO RELATED APPLICATION

This application claims priority from and the benefit of Korean Patent Application No. 10-2020-0004019 filed on Jan. 13, 2020 which is hereby incorporated by reference for all purposes as if fully set forth herein.

BACKGROUND

Field

Exemplary embodiments and implementations of the invention relate generally to a display device. More particularly, embodiments of the present inventive concept relate to a foldable display device.

Discussion of the Background

Flat panel display devices are used as display devices for replacing a cathode ray tube display device due to lightweight and thin characteristics thereof. As representative examples of such flat panel display devices, there are a liquid crystal display device and an organic light emitting diode display device.

Recently, a foldable display device has been developed in which a lower substrate and an upper substrate of a display panel included in the display device may include a flexible material, and a part of the display panel may be repeatedly folded and unfolded. For example, the display panel may include a polyimide substrate and a thin film encapsulation structure so as to have flexibility. In addition, the foldable display device may display an image even in a portion where the display panel is folded. In other words, the foldable display device may include a display area in which an image is displayed, and a part of the display area may be folded. The foldable display device may further include a hinge cover member disposed in a folding portion of the display area on a bottom surface of the display panel, and a lower cover member disposed in the remaining portion of the display area on the bottom surface of the display panel. The hinge cover member may protect a folding portion of the display panel, and the lower cover member may protect the bottom surface of the display panel except for the folding portion of the display panel. However, when a gap is formed between the hinge cover member and the lower cover member, and foreign substances penetrate into the foldable display device through the gap, a defect may be incurred in a folding portion of the foldable display device.

The above information disclosed in this Background section is only for understanding of the background of the inventive concepts, and, therefore, it may contain information that does not constitute prior art.

SUMMARY

Exemplary embodiments provide a foldable display device.

Additional features of the inventive concepts will be set forth in the description which follows, and in part will be apparent from the description, or may be learned by practice of the inventive concepts.

Exemplary embodiments provide a display device including a display panel, a first metal member, a hinge member, and a first blocking member. The display panel includes a foldable area. The first metal member is disposed in a first portion on a bottom surface of the display panel. The hinge member overlaps the foldable area on a bottom surface of the first metal member, and includes a first curved portion having a first curvature. The first blocking member is disposed between the bottom surface of the first metal member and the first curved portion of the hinge member, and includes a first surface having the first curvature.

In exemplary embodiments, the hinge member may include a groove recessed in a direction from the display panel to the first blocking member, and a part of the groove may be defined as the first curved portion.

In exemplary embodiments, when the display panel is unfolded, the first curved portion may face the first surface of the first blocking member.

In exemplary embodiments, a first virtual concentric circle having the first curvature and corresponding to the first surface may be defined. A center of the first virtual concentric circle may be defined as a first rotation axis, and the first metal member and the first blocking member may rotate about the first rotation axis.

In exemplary embodiments, the first rotation axis may be located on a neutral plane of the display panel.

In exemplary embodiments, when the display panel is unfolded and folded, the first curvature of the hinge member may be defined such that a distance between the first surface and the first curved portion is minimized.

In exemplary embodiments, the first blocking member may further include a second surface facing the bottom surface of the first metal member and a third surface located between the first surface and the second surface.

In exemplary embodiments, when the display panel is folded, the third surface may face the first curved portion.

In exemplary embodiments, the third surface may be located inside the groove.

In exemplary embodiments, the hinge member may further include a second curved portion spaced apart from the first curved portion.

In exemplary embodiments, the display device may further include a second metal member disposed in a second portion on the bottom surface of the display panel, and the second metal member may be spaced apart from the first metal member.

In exemplary embodiments, the display device may further include a second blocking member disposed between a bottom surface of the second metal member and the second curved portion of the hinge member. The second blocking member may include a fourth surface having the first curvature, and may be spaced apart from the first blocking member.

In exemplary embodiments, when the display panel is unfolded, the second curved portion may face the fourth surface of the second blocking member.

In exemplary embodiments, a second virtual concentric circle having the first curvature and corresponding to the fourth surface may be defined. A center of the second virtual concentric circle may be defined as a second rotation axis, and the second metal member and the second blocking member may rotate about the second rotation axis.

In exemplary embodiments, the second rotation axis may be located on a neutral plane of the display panel.

In exemplary embodiments, the first virtual concentric circle may partially overlap the second virtual concentric circle.

In exemplary embodiments, the second blocking member may further include a fifth surface facing the bottom surface of the second metal member and a sixth surface located between the fourth surface and the fifth surface.

In exemplary embodiments, when the display panel is unfolded, the third surface may face the sixth surface. When the display panel is folded, the sixth surface may face the second curved portion.

In exemplary embodiments, the first blocking member and the second blocking member may be located symmetrically to each other.

In exemplary embodiments, the display panel may further include a display area, and a part of the display area may be defined as the foldable area.

Because the display device according to the exemplary embodiments of the present invention includes the first blocking member and the second blocking member, when the display panel is folded and unfolded, a space between the first and second metal members and the hinge member may be minimized. Accordingly, the foreign substances penetrating from the outside may not penetrate into the space between the hinge member and the display panel, and a defect of the display device due to the foreign substances may not be incurred.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

Exemplary embodiments can be understood in more detail from the following description taken in conjunction with the accompanying drawings, in which.

DETAILED DESCRIPTION

Figure 1:
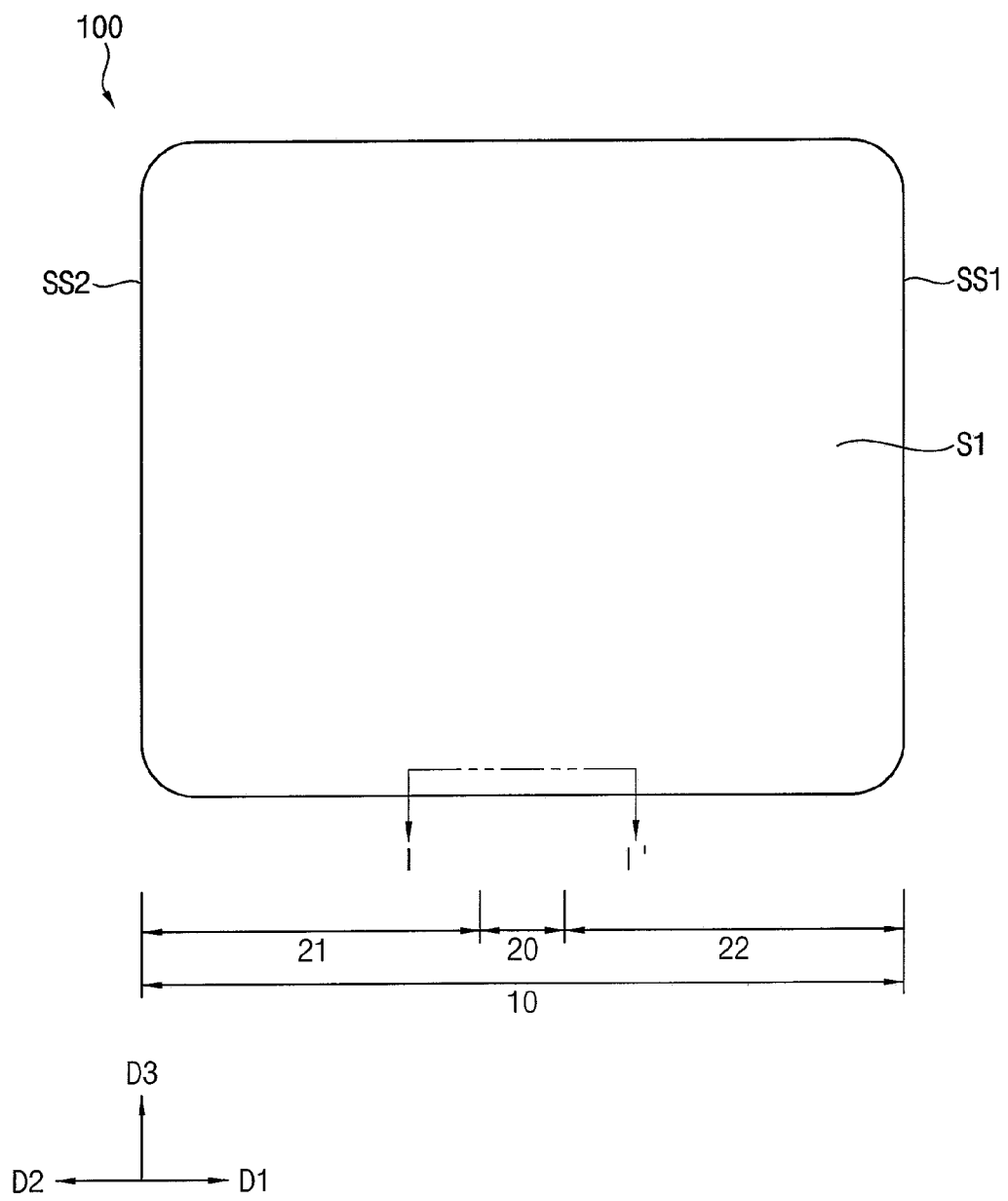
FIG. 1 is a plan view illustrating a display device according to exemplary embodiments of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, display devices according to exemplary embodiments of the present invention will be described in detail with reference to the accompanying drawings. In the accompanying drawings, same or similar reference numerals refer to the same or similar elements.

Figure 2:
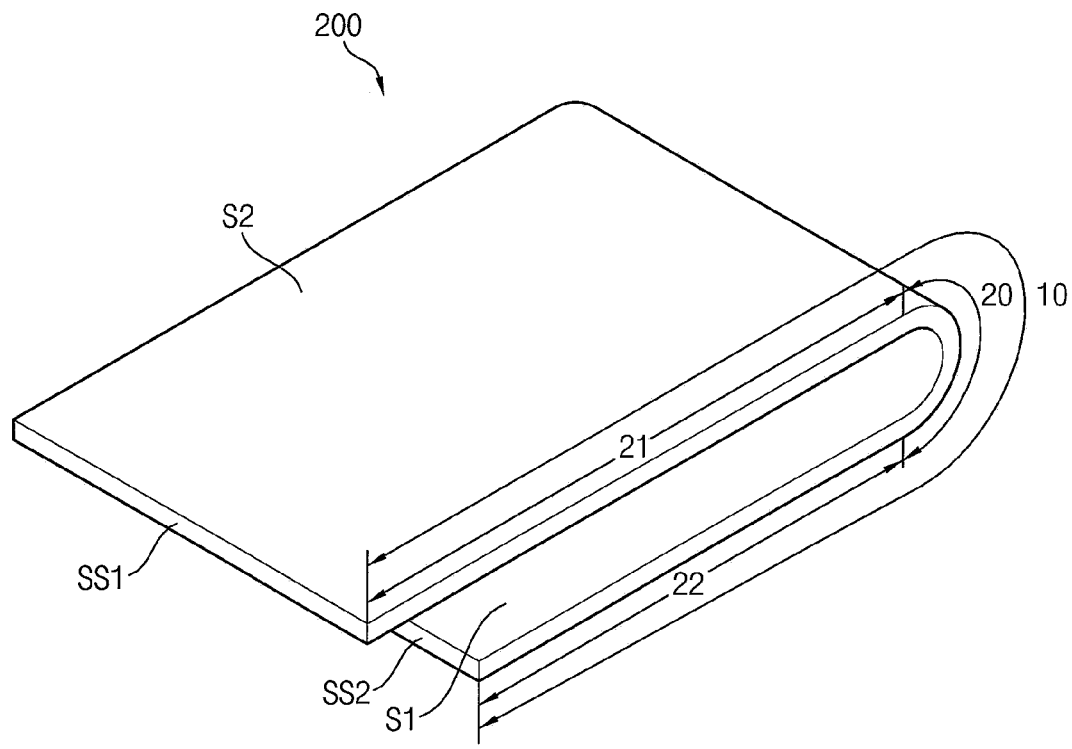
FIG. 2 is a perspective view illustrating a folded shape of a display panel included in the display device of FIG. 1.
Figure 3:
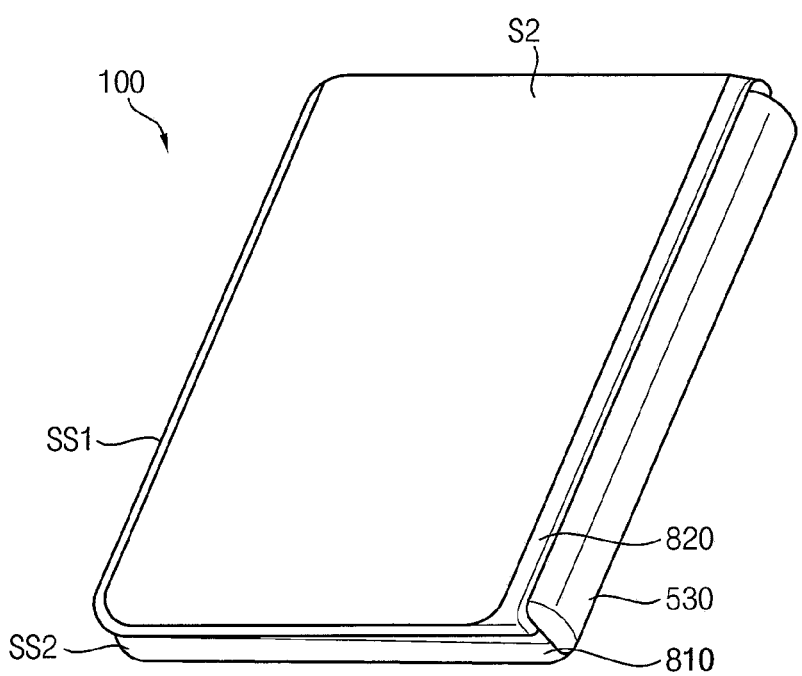
FIG. 3 is a perspective view illustrating a folded shape of the display device of FIG. 1.

FIG. 1 is a plan view illustrating a display device according to exemplary embodiments of the present invention, FIG. 2 is a perspective view illustrating a folded shape of a display panel included in the display device of FIG. 1, and FIG. 3 is a perspective view illustrating a folded shape of the display device of FIG. 1. For example, FIG. 1 illustrates a state in which a display device 100 is unfolded.

Referring to FIGS. 1, 2 and 3, the display device 100 may include a display panel 200, a first lower cover member 810, a second lower cover member 820, a hinge cover member 530, and the like.

In this case, as illustrated in FIG. 1, the display device 100 may include a display area 10, and the display area 10 may be divided into a foldable area 20, a first non-foldable area 21, and a second non-foldable area 22. The display area 10 refers to an area in which an image is displayed by the display panel 200 including a plurality of pixels, and the foldable area 20 refers to an area in which the display device 100 is folded or unfolded. A part of the display area 10 may be defined as the foldable area 20. In other words, the image may be displayed even in the foldable area 20. In addition, the display device 100 may have a first surface S1 on which an image is displayed and a second surface S2 facing the first surface S1. Furthermore, the display device 100 may have a first side surface SS1 and a second side surface SS2 facing the first side surface SS1.

Referring back to FIGS. 2 and 3, the display panel 200 may also be divided into a foldable area 20, a first non-foldable area 21, and a second non-foldable area 22, and may also have a first surface S1, a second surface S2 facing the first surface S1, a first side surface SS1, and a second side surface SS2 facing the first side surface SS1.

Among components of the display device 100, the display panel 200 may be substantially folded and unfolded. When the display panel 200 located in the foldable area 20 is folded, the first side surface SS1 of the display panel 200 and the second side surface SS2 of the display panel 200 may be adjacent to each other. In addition, the display panel 200 located in the foldable area 20 may have a curved shape. In this case, the first surface S1 may be located on an inner side, and the second surface S2 may be located on an outer side. Alternatively, the display panel 200 may be folded such that the first surface S1 is located on the outer side and the second surface S2 is located on the inner side.

The first lower cover member 810, the second lower cover member 820, and the hinge cover member 530 may be have surfaces that correspond to the second surface S2 of the display panel 200. In this case, the first surface S1 of the display device 100 may correspond to the first surface S1 of the display panel 200, and the second surface S2 of the display device 100 may correspond to bottom surfaces of the first lower cover member 810 and the second lower cover member 820.

The hinge cover member 530 may be disposed in the foldable area 20 corresponding to the second surface S2 of the display panel 200. The first lower cover member 810 may be disposed in the first non-foldable area 21 of the second surface S2 of the display panel 200, and the second lower cover member 820 may be disposed in the second non-foldable area 22 in relation to the second surface S2 of the display panel 200.

As illustrated in FIG. 3, when the display device 100 is folded, the first side surface SS1 of the display device 100 and the second side surface SS2 of the display device 100 may be adjacent to each other. In addition, a relatively large area of the hinge cover member 530 located in the foldable area 20 may be exposed to an outside. The hinge cover member 530 may have an external facing side 530a. For example, a relatively small area of the external facing side 530a of the hinge cover member 530 located between the first lower cover member 810 and the second lower cover member 820 may be exposed to the outside when the display device 100 is unfolded (see FIG. 4), and a relatively large area of the external facing side 530a of the hinge cover member 530 may be exposed to the outside when the display device 100 is folded (see FIG. 8). In this case, a gap of various lengths may be formed between the first and second lower cover members 810 and 820 and the hinge cover member 530. In other words, the hinge cover member 530 may be spaced apart from the first and second lower cover members 810 and 820 by a predetermined interval when the display device is folded and unfolded.

Figure 4:
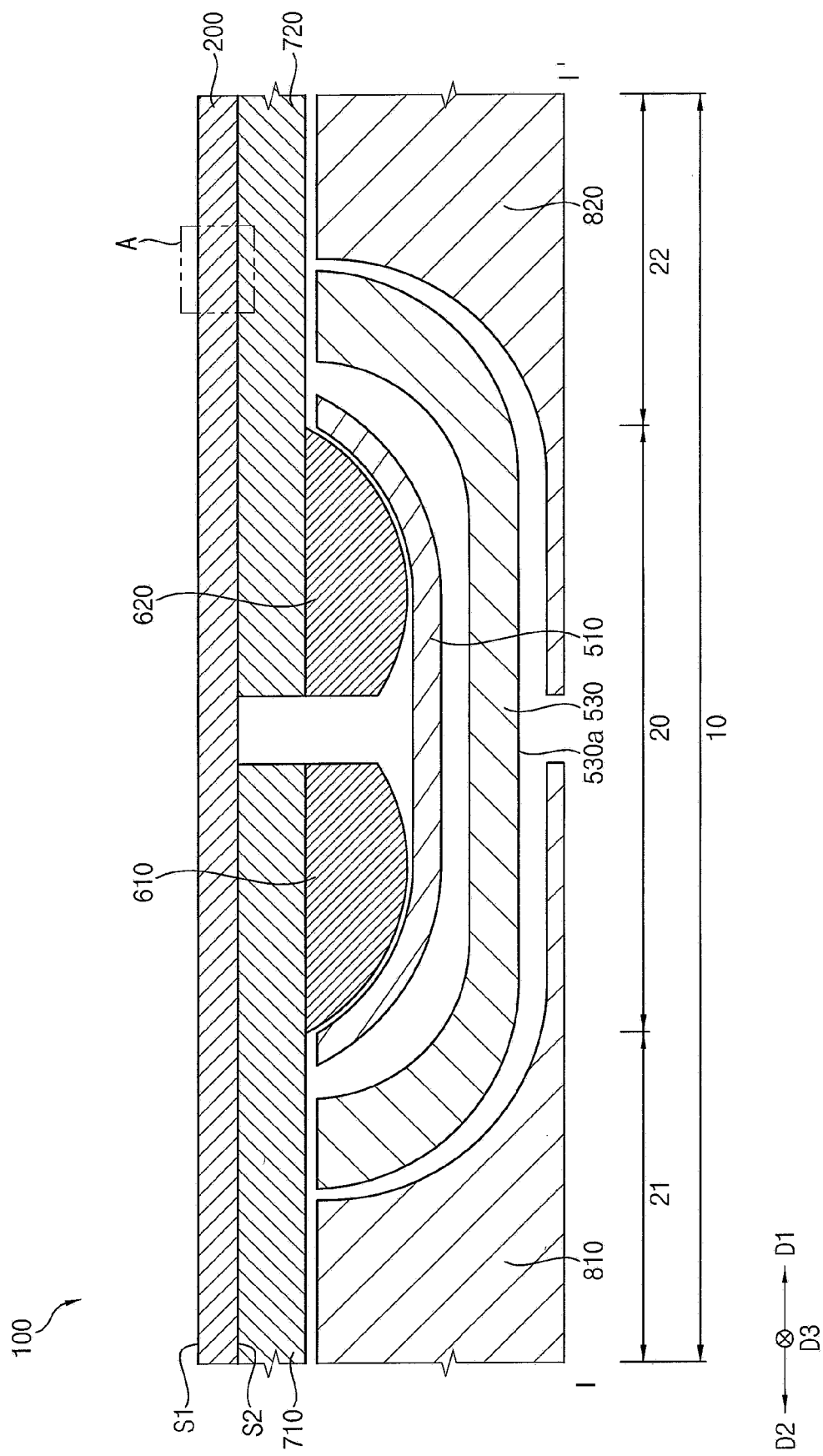
FIG. 4 is a cross-sectional view taken along line I-I' of FIG. 1.
Figure 5:
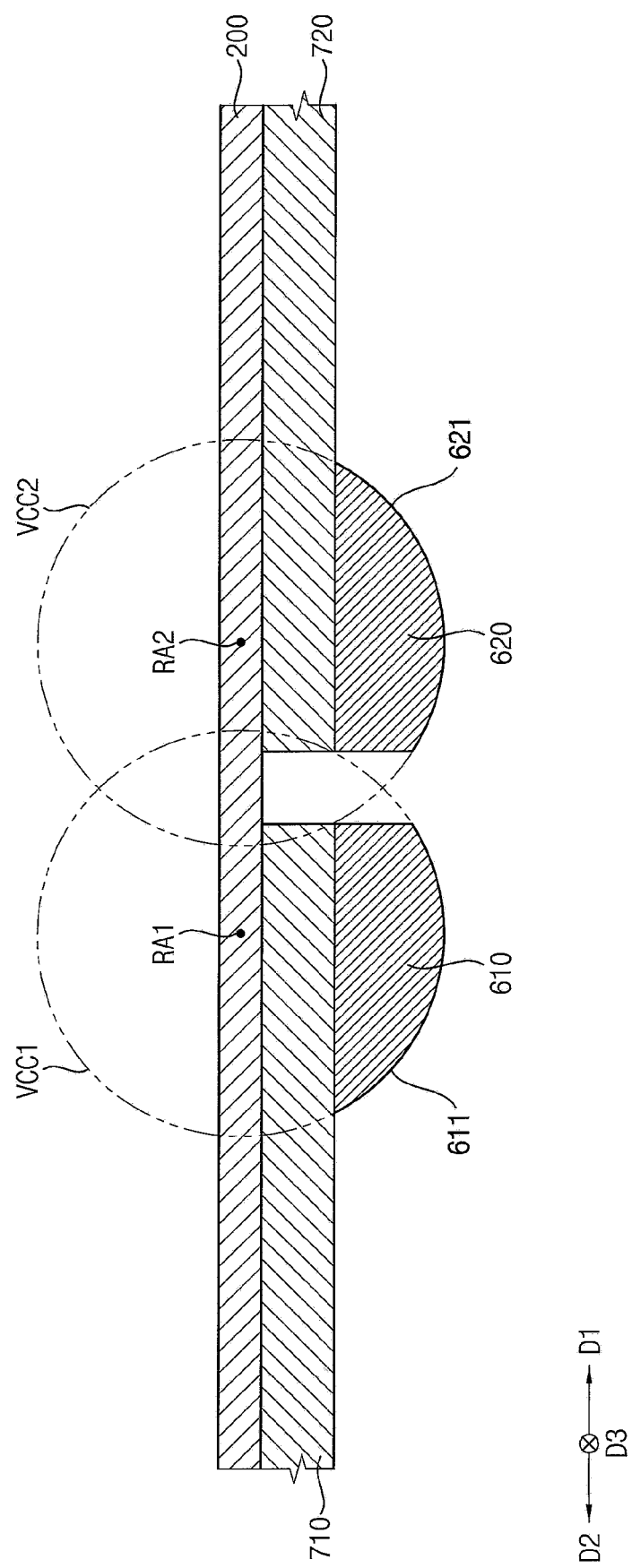
FIGS. 5 and 6 are cross-sectional views illustrating a blocking member included in the display device of FIG. 4
Figure 6:
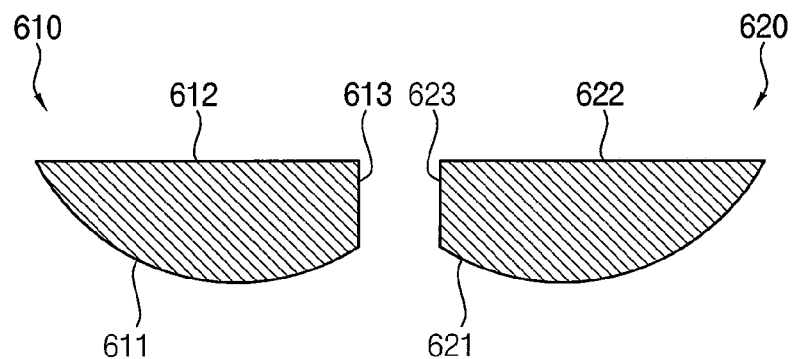
Figure 7:
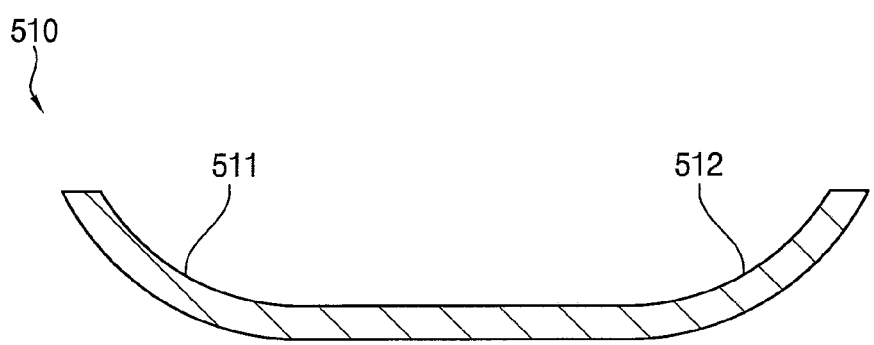
FIG. 7 is a cross-sectional view illustrating a hinge member included in the display device of FIG. 4.

FIG. 4 is a cross-sectional view taken along line I-I' of FIG. 1, FIGS. 5 and 6 are cross-sectional views illustrating a blocking member included in the display device of FIG. 4, and FIG. 7 is a cross-sectional view illustrating a hinge member included in the display device of FIG. 4. For example, FIG. 4 is a sectional view illustrating a state in which the display device 100 is unfolded.

Referring to FIGS. 4, 5, 6, and 7, the display device 100 may include a display panel 200, a first metal member 710, a second metal member 720, a first blocking member 610, a second blocking member 620, a hinge member 510, a hinge cover member 530, a first lower cover member 810, and a second lower cover member 820.

The display panel 200 may be provided. As described above, the display panel 200 may be divided into a foldable area 20, a first non-foldable area 21, and a second non-foldable area 22. For example, the first non-foldable area 21 may be located on a left side of the display panel 200, the second non-foldable area 22 may be located on a right side of the display panel 200, and the foldable area 20 may be located between the first non-foldable area 21 and the second non-foldable area 22.

The first metal member 710 may be disposed in a part of the foldable area 20 and the first non-foldable area 21 (e.g., a first portion on a bottom surface of the display panel 200) on the bottom surface of the display panel 200 (e.g., the second surface S2 of the display panel 200), and the second metal member 720 may be disposed in a part of the foldable area 20 and the second non-foldable area 22 (e.g., a second portion on the bottom surface of the display panel 200) on the bottom surface of the display panel 200. The first metal member 710 and the second metal member 720 may be spaced apart from each other in a first direction D1 parallel to the bottom surface of the display panel 200 or a second direction D2 opposite to the first direction D1 on the bottom surface of the display panel 200. A separation distance between the first metal member 710 and the second metal member 720 in the foldable area 20 may be determined according to a radius of curvature of the display panel 200 in the foldable area 20. In addition, because each of the first and second metal members 710 and 720 is disposed in part of the foldable area 20, each of the first and second metal members 710 and 720 may prevent the display panel 200 from sagging into the foldable area 20, and may serve to shield static electricity, electromagnetic waves, electric fields, magnetic fields, and the like generated from the outside. Each of the first and second metal members 710 and 720 may include Stainless Steel (SUS). In some embodiments, each of the first and second metal members 710 and 720 may include a metal, an alloy, and the like. For example, each of the first and second metal members 710 and 720 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, a silver-containing alloy, a copper-containing alloy, a molybdenum-containing alloy, and the like. These may be used alone or in combination with each other. In other exemplary embodiments, a step difference compensation member and an adhesive member may be additionally provided on a bottom surface of each of the first and second metal members 710 and 720. The first lower cover member 810 and the second lower cover member 820 may be adhered to the first and second metal members 710 and 720 through the adhesive member, respectively.

The first blocking member 610 may be disposed in the foldable area 20 between the bottom surface of the first metal member 710 and the hinge member 510, and the second blocking member 620 may be disposed in the foldable area 20 between the bottom surface of the second metal member 720 and the hinge member 510. The first blocking member 610 may be fixed to the bottom surface of the first metal member 710 through a scheme such as bonding, the adhesive member, and welding, and the second blocking member 620 may be fixed to the bottom surface of the second metal member 720 through the same scheme as described above. In other exemplary embodiments, the first blocking member 610 and the first metal member 710 may be formed through insert injection molding. In this case, the first blocking member 610 and the first metal member 710 may be integrally formed by using the same material. In addition, the second blocking member 620 and the second metal member 720 may be formed through the insert injection molding. In this case, the second blocking member 620 and the second metal member 720 may be integrally formed by using the same material.

The first blocking member 610 and the second blocking member 620 may be spaced apart from each other in the first direction D1. As illustrated in FIG. 6, the first blocking member 610 may have a first surface 611 having a first curvature, a second surface 612 facing the bottom surface of the first metal member 710, and a third surface 613 located between the first surface 611 and the second surface 612. In addition, the second blocking member 620 may have a fourth surface 621 having the first curvature, a fifth surface 622 facing the bottom surface of the second metal member 720, and a sixth surface 623 located between the fourth surface 621 and the fifth surface 622.

In the exemplary embodiments, when the display panel 200 is unfolded, the third surface 613 and the sixth surface 623 may face each other, and may be parallel to each other. In addition, the third surface 613 may be aligned with a side surface of the first metal member 710 located in the foldable area 20, and the sixth surface 623 may be aligned with a side surface of the second metal member 720 located in the foldable area 20. Moreover, the first blocking member 610 and the second blocking member 620 may be located symmetrically to each other and have mirrored shapes.

Referring to the first curvature, as illustrated in FIG. 5, a first virtual concentric circle VCC1 having the first curvature and corresponding to the first surface 611 may be defined, and a center of the first virtual concentric circle VCC1 may be defined as a first rotation axis RA1. The first rotation axis RA1 may correspond to a third direction D3 perpendicular to the first and second directions D1 and D2. In this case, the first metal member 710 and the first blocking member 610 may rotate in a clockwise direction about the first rotation axis RA1. In addition, a second virtual concentric circle VCC2 having the first curvature and corresponding to the fourth surface 621 may be defined, and a center of the second virtual concentric circle VCC2 may be defined as a second rotation axis RA2. The second rotation axis RA2 may correspond to the third direction D3. In this case, the second metal member 720 and the second blocking member 620 may rotate in a counterclockwise direction about the second rotation axis RA2. In the exemplary embodiments, the first rotation axis RA1 and the second rotation axis RA2 may be located on a neutral plane of the display panel 200. In this case, the neutral plane refers to a plane that neither stretches nor shrinks when viewed in a sectional view in a case where an object is bent. In a case of an object formed of a single material, the neutral plane coincides with an intermediate surface of the object. Meanwhile, in a case of a composite material formed of at least two materials, the neutral plane may not coincide with an intermediate surface of the composite material. In addition, the first virtual concentric circle VCC1 may partially overlap the second virtual concentric circle VCC2.

Each of the first blocking member 610 and the second blocking member 620 may include a material having a relatively low coefficient of friction. For example, each of the first blocking member 610 and the second blocking member 620 may include: engineering plastic such as polyacetal or polyoxymethylene (POM); Teflon; a metal mirror-finished through lapping, polishing, chemical mechanical polishing (CMP), grinding, cutting, machining, and the like; a sponge; and the like.

The hinge member 510 may overlap the foldable area 20 on the bottom surface of the first metal member 710 and the bottom surface of the second metal member 720. A width of the hinge member 510 in the D1-D2 direction may be wider than a width of the foldable area 20. The hinge member 510 may include a groove recessed in a direction from the display panel 200 to the hinge cover member 530. For example, as illustrated in FIG. 7, the hinge member 510 may include a first curved portion 511 having the first curvature, a second curved portion 512 having the first curvature, and a flat portion located between the first curved portion 511 and the second curved portion 512. The first curved portion 511, the flat portion, and the second curved portion 512 may be consecutively located. That is, the first curved portion 511, the flat portion, and the second curved portion 512 may be integrally formed, and the groove of the hinge member 510 may be defined by the first curved portion 511, the flat portion, and the second curved portion 512. In other words, a part of the groove may be defined as the first curved portion 511 or the second curved portion 512.

The hinge member 510 may extend in the third direction D3. In other words, the hinge member 510 may have a bar shape extending in the third direction D3 similarly to the hinge cover member 530 illustrated in FIG. 3. The hinge cover member 530 may surround the first blocking member 610 and the second blocking member 620 so that the first blocking member 610 and the second blocking member 620 may not be exposed to the outside, and may protect the first blocking member 610, the second blocking member 620, and the display panel 200 which are disposed in the foldable area 20. The first curved portion 511, the second curved portion 512, and the flat portion of the hinge member 510 may be spaced apart from the first blocking member 610 and the second blocking member 620. When the display panel 200 is unfolded, the first curved portion 511 and the first surface 611 may be adjacent and face each other, and the second curved portion 512 and the fourth surface 621 may be adjacent and face each other. The hinge member 510 may include a material having a relatively low coefficient of friction. For example, the hinge member 510 may include engineering plastic, Teflon, a mirror-finished metal, a sponge, and the like In the exemplary embodiments, when the display panel 200 is unfolded, the first curvature of the hinge member 510 may be defined such that a distance between the first surface 611 and the first curved portion 511 is minimized. In addition, even when the display panel 200 is folded, the first curvature of the hinge member 510 may be defined such that the distance between the first surface 611 and the first curved portion 511 is minimized (see FIG. 8). In other words, the first blocking member 610 and the second blocking member 620 may block foreign substances from penetrating into a space between the display panel 200 and the hinge member 510. In the unfolded and folded positions, the width of the hinge member 510 in the D1-D2 direction extends farther than the outer edges of the first blocking member 610 and the second blocking member 620.

Without features described herein, foreign substances may penetrate into the gap between the hinge cover member 530 and the first and second lower cover members 810 and 820, and when the display panel 200 is folded and unfolded, the foreign substances may penetrate between the display panel 200 and the hinge member 510, so that a defect of the display panel 200 may be incurred.

In exemplary embodiments, when the first and second blocking members 610 and 610 are formed of a sponge material, the first and second blocking members 610 and 610 may make contact with the hinge member 510. In such a case, the first and second blocking members 610 and 610 may completely block foreign substances from penetrating into the space between the display panel 200 and the hinge member 510.

The hinge cover member 530 may be disposed under the hinge member 510. The hinge cover member 530 may surround the hinge member 510 so that the hinge member 510 may not be exposed, and the hinge cover member 530 may protect the hinge member 510. In another sectional view of the display device 100, the hinge member 510 may be fixed to the hinge cover member 530. The hinge cover member 530 may include SUS. In other exemplary embodiments, the display device 100 may further include a first rotator connected to the first metal member 710 between the hinge member 510 and the hinge cover member 530, a second rotator connected to the second metal member 720, a slider which partially covers each of the first and second rotators, a housing hinge member which covers the first and second rotators and the slider, and the like. In this case, the hinge cover member 530 may surround the first and second rotators, the slider, and the housing hinge member.

The first lower cover member 810 may be disposed in the first non-foldable area 21 on the bottom surface of the display panel 200, and the second lower cover member 820 may be disposed in the second non-foldable area 22 on the bottom surface of the display panel 200. The first lower cover member 810 and the second lower cover member 820 may protect the bottom surface of the display panel 200. As described above, in another sectional view of the display device 100, each of the first and second lower cover members 810 and 820 may be fixed to the bottom surface of the display panel 200 through the adhesive member. In addition, the first and second lower cover members 810 and 820 may be respectively fastened to both ends of the hinge cover member 530 (e.g., both ends of a major axis of the hinge cover member 530) by using the hinge cover member 530 as a hinge such that the first and second lower cover members 810 and 820 may be folded and unfolded together with the display panel 200 (e.g., see the hinge cover member 530 of FIG. 3). Each of the first and second lower cover members 810 and 820 may include SUS.

Figure 8:
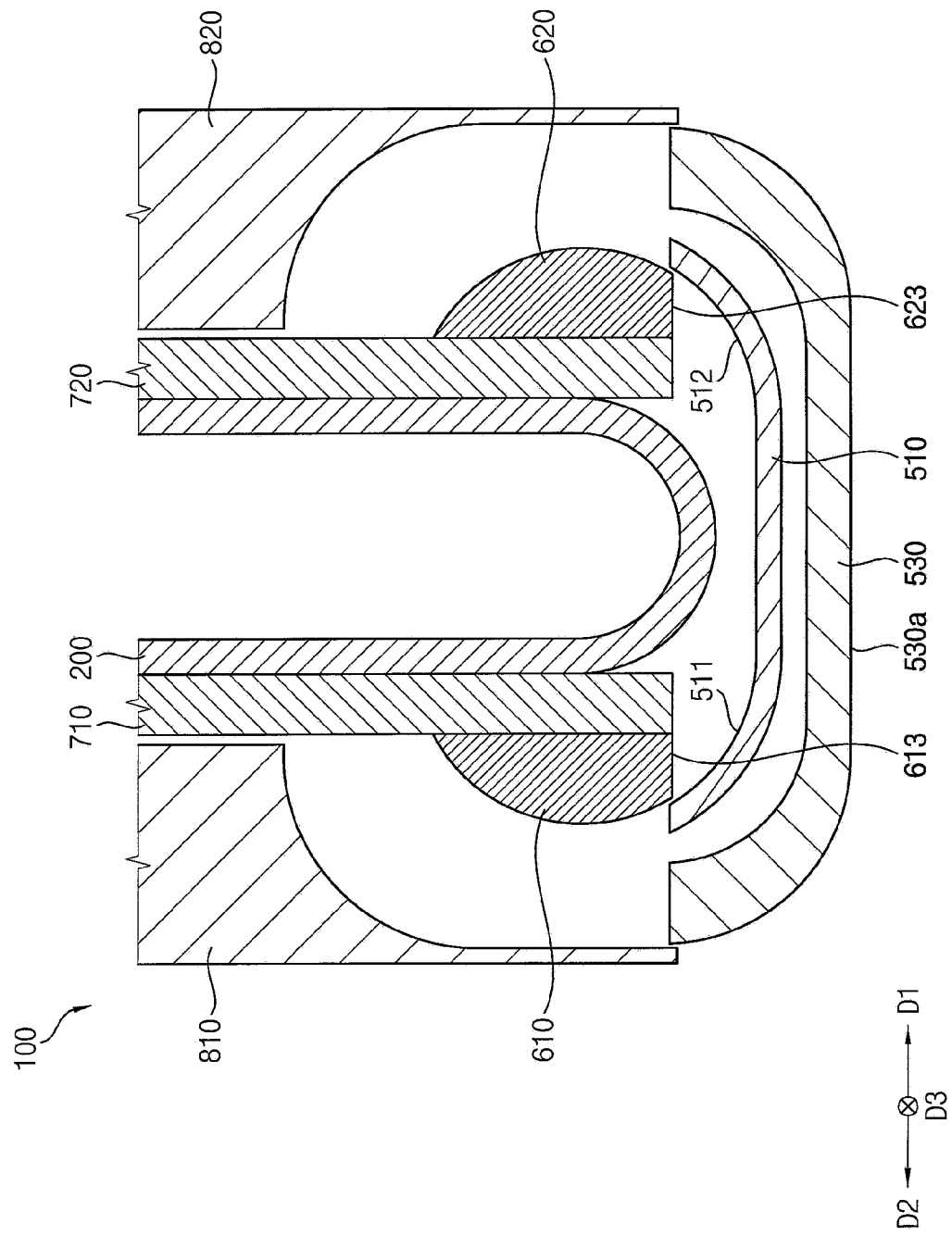
FIG. 8 is a cross-sectional view illustrating a folded shape of the display device of FIG. 4.
Figure 9:
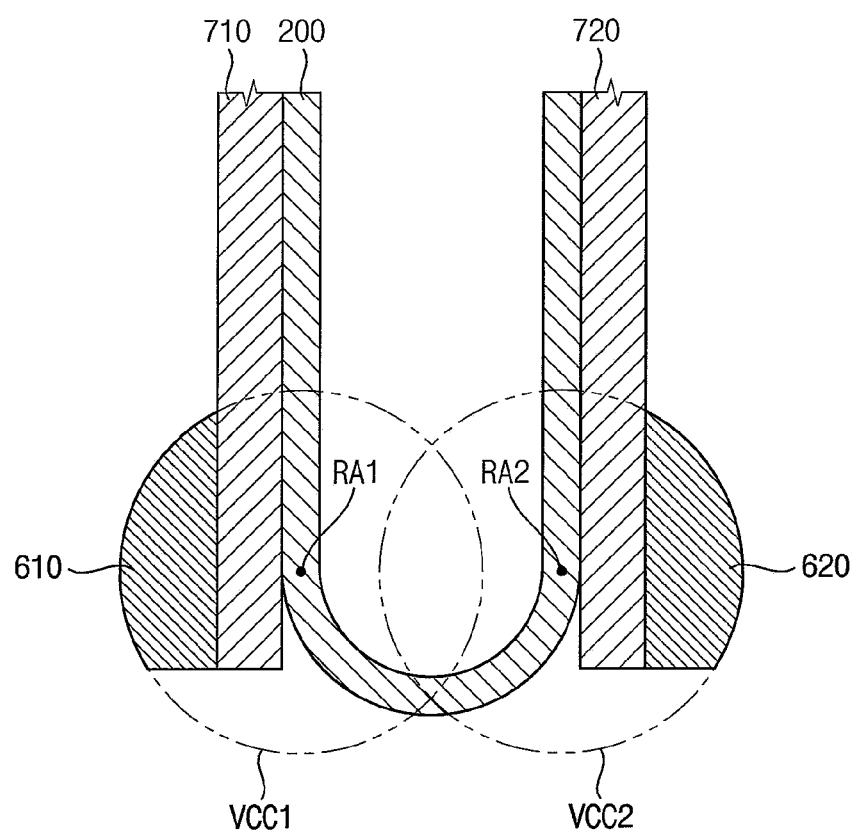
FIG. 9 is a cross-sectional view illustrating a blocking member included in the display device of FIG. 8.

FIG. 8 is a cross-sectional view illustrating a folded shape of the display device of FIG. 4, and FIG. 9 is a cross-sectional view illustrating a blocking member included in the display device of FIG. 8.

Referring to FIGS. 4, 8, and 9, when the display panel 200 is folded, the third surface 613 of the first blocking member 610 may face the first curved portion 511 of the hinge member 510, and the sixth surface 623 of the second blocking member 620 may face the second curved portion 512 of the hinge member 510. In other words, the third surface 613 and the sixth surface 623 may be located inside the groove of the hinge member 510, while the first surface 611 and the second surface 612 partially extend outside of the groove of the hinge member 510. In addition, when the display panel 200 is folded, the first blocking member 610 and the second blocking member 620 may be located symmetrically to each other.

In the exemplary embodiments, because the third surface 613 and the sixth surface 623 are located inside the groove, even if the display panel 200 is folded, the foreign substances may not penetrate between the hinge member 510 and the display panel 200.

As illustrated in FIG. 9, when the display panel 200 is folded, the first metal member 710 and the first blocking member 610 may rotate about the first rotation axis RA1, and the second metal member 720 and the second blocking member 620 may rotate about the second rotation axis RA2. In the exemplary embodiments, the first rotation axis RA1 and the second rotation axis RA2 may be located on the neutral plane of the display panel 200.

Because the display device 100 according to the exemplary embodiments of the present invention includes the first blocking member 610 and the second blocking member 620 on an opposite side of the first and second metal member 710 and 720 as the display panel 200, when the display panel 200 is folded and unfolded, a space between the first and second metal members 710 and 720 and the hinge member 510 may be minimized. Accordingly, the foreign substances penetrating from the outside may not penetrate into the space between the hinge member 510 and the display panel 200, and a defect of the display device 100 due to the foreign substances may not be incurred.

Figure 10:
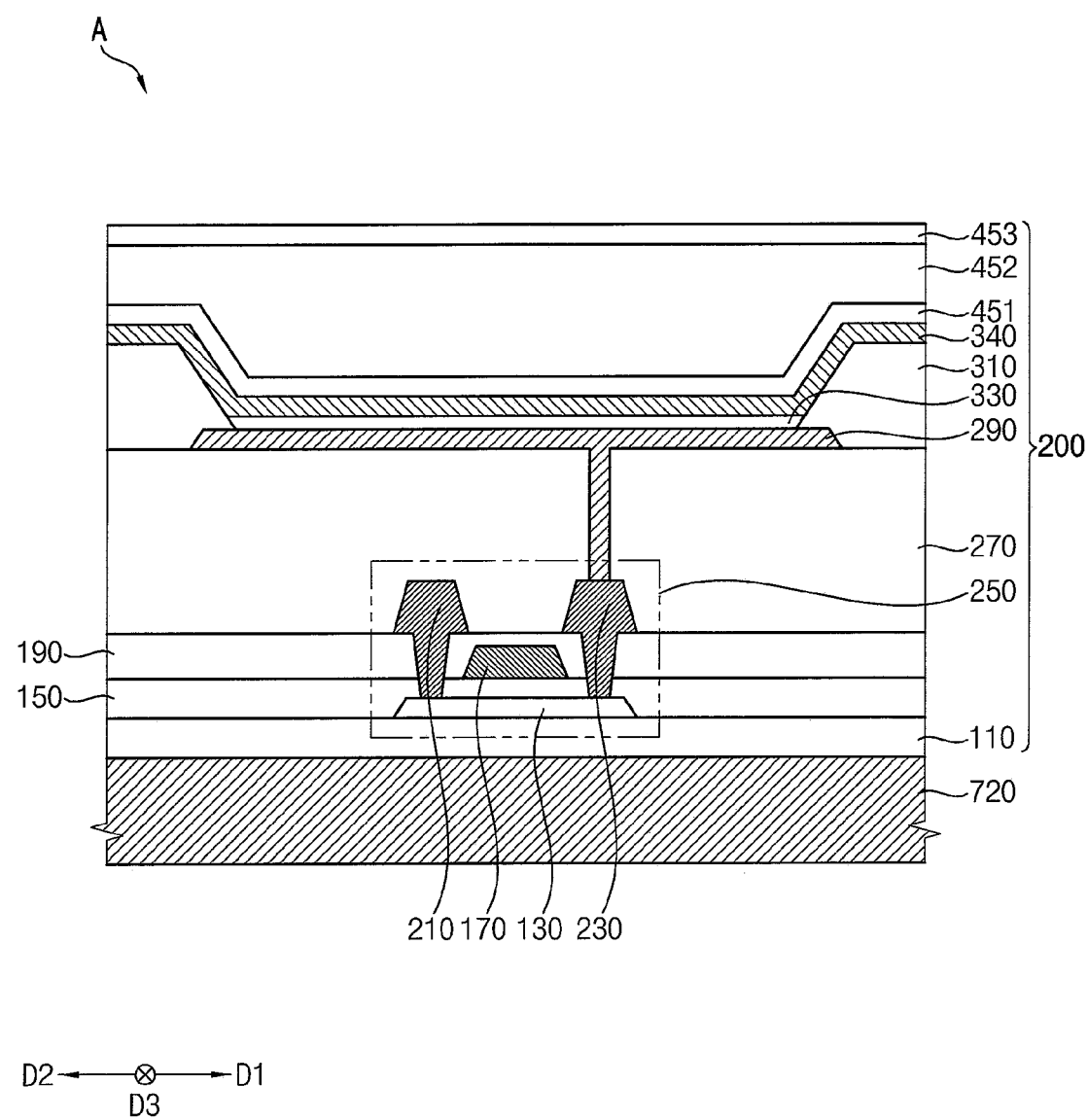
FIG. 10 is an enlarged sectional view illustrating 'A' region of the display device of FIG. 4.

FIG. 10 is an enlarged sectional view illustrating 'A' region of the display device of FIG. 4.

Referring to FIG. 10, the display panel 200 may include a substrate 110, a semiconductor element 250, a planarization layer 270, a lower electrode 290, a pixel defining layer 310, a light emitting layer 330, an upper electrode 340, a first inorganic thin film encapsulation layer 451, an organic thin film encapsulation layer 452, a second inorganic thin film encapsulation layer 453, and the like. The semiconductor element 250 may include an active layer 130, a gate insulating layer 150, a gate electrode 170, an insulating interlayer 190, a source electrode 210, and a drain electrode 230.

The substrate 110 including a transparent or opaque material may be provided. The substrate 110 may be disposed on the second metal member 720 (or the first metal member 710). The substrate 110 may be a transparent resin substrate. Examples of the transparent resin substrate that may be used as the substrate 110 include a polyimide substrate. In this case, the polyimide substrate may include a first polyimide layer including an organic insulating material, a barrier film layer including an inorganic insulating material, a second polyimide layer including an organic insulating material, and the like. In other exemplary embodiments, the substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like.

A buffer layer may be disposed on the substrate 110. The buffer layer may prevent metal atoms or impurities from diffusing from the substrate 110 to the semiconductor element 250, and may control a heat transfer rate during a crystallization process to form the active layer to obtain a substantially uniform active layer. In addition, when a surface of the substrate 110 is not uniform, the buffer layer may serve to improve flatness of the surface of the substrate 110. Depending on a type of the substrate 110, at least two buffer layers may be provided on the substrate 110, or the buffer layer may not be provided. For example, the buffer layer may include an organic insulating material or an inorganic insulating material.

The active layer 130 may be disposed on the substrate 110. The active layer 130 may include a metal oxide semiconductor, an inorganic semiconductor (e.g., amorphous silicon or poly silicon semiconductor), an organic semiconductor, or the like. The active layer 130 may have source and drain regions.

The gate insulating layer 150 may be disposed on the active layer 130. For example, the gate insulating layer 150 may sufficiently cover the active layer 130 on the substrate 110, and may have a substantially flat top surface without creating a step around the active layer 130. In some embodiments, the gate insulating layer 150 may be disposed along a profile of the active layer 130 with a uniform thickness to cover the active layer 130 on the substrate 110. The gate insulating layer 150 may include a silicon compound, metal oxide, and the like. For example, the gate insulating layer 150 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like. In other exemplary embodiments, the gate insulating layer 150 may have a multilayer structure including a plurality of insulating layers. For example, the insulating layers may have mutually different thicknesses or may include mutually different materials.

The gate electrode 170 may be disposed on the gate insulating layer 150. The gate electrode 170 may be disposed at a portion of the gate insulating layer 150 under which the active layer 130 is located. The gate electrode 170 may include a metal, an alloy, metal nitride, conductive metal oxide, a transparent conductive material, and the like. For example, the gate electrode 170 may include Au, Ag, Al, Pt, Ni, Ti, Pd, Mg, Ca, Li, Cr, Ta, W, Cu, Mo, Sc, Nd, Ir, an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In other exemplary embodiments, the gate electrode 170 may have a multilayer structure including a plurality of metal layers. For example, the metal layers may have mutually different thicknesses or may include mutually different materials.

The insulating interlayer 190 may be disposed on the gate electrode 170. For example, the insulating interlayer 190 may sufficiently cover the gate electrode 170 on the gate insulating layer 150, and may have a substantially flat top surface without creating a step around the gate electrode 170. In some embodiments, the insulating interlayer 190 may be disposed along a profile of the gate electrode 170 with a uniform thickness to cover the gate electrode 170 on the gate insulating layer 150. The insulating interlayer 190 may include a silicon compound, metal oxide, and the like. In some embodiments, the insulating interlayer 190 may have a multilayer structure including a plurality of insulating layers. For example, the insulating layers may have mutually different thicknesses or may include mutually different materials.

The source electrode 210 and the drain electrode 230 may be disposed on the insulating interlayer 190. The source electrode 210 may be connected to the source region of the active layer 130 through a contact hole formed by removing first parts of the gate insulating layer 150 and the insulating interlayer 190, and the drain electrode 230 may be connected to the drain region of the active layer 130 through a contact hole formed by removing second parts of the gate insulating layer 150 and the insulating interlayer 190. Each of the source electrode 210 and the drain electrode 230 may include a metal, an alloy, metal nitride, conductive metal oxide, a transparent conductive material, and the like. These may be used alone or in combination with each other. In other exemplary embodiments, each of the source electrode 210 and the drain electrode 230 may have a multilayer structure including a plurality of metal layers. For example, the metal layers may have mutually different thicknesses or may include mutually different materials.

Accordingly, the semiconductor element 250 including the active layer 130, the gate insulating layer 150, the gate electrode 170, the insulating interlayer 190, the source electrode 210, and the drain electrode 230 may be provided.

Although the semiconductor element 250 has been described as having a top gate structure, the configuration of the present invention is not limited thereto. For example, the semiconductor element 250 may have a bottom gate structure, a double gate structure, or the like.

In addition, although the display device 100 has been described as including one semiconductor element, the configuration of the present invention is not limited thereto. For example, the display device 100 may include at least one semiconductor element and at least one storage capacitor.

The planarization layer 270 may be disposed on the insulating interlayer 190, the source electrode 210, and the drain electrode 230. For example, the planarization layer 270 may have a relatively thick thickness. In this case, the planarization layer 270 may have a substantially flat top surface. In order to implement such a flat top surface of the planarization layer 270, a planarization process may be additionally performed on the planarization layer 270. In some embodiments, the planarization layer 270 may be disposed along a profile of the source electrode 210 and the drain electrode 230 with a uniform thickness on the insulating interlayer 190. The planarization layer 270 may be formed of an organic insulating material or an inorganic insulating material. In the exemplary embodiments, the planarization layer 270 may include an organic insulating material. For example, the planarization layer 270 may include a photoresist, a polyacryl-based resin, a polyimide-based resin, a polyamide-based resin, a siloxane-based resin, an acryl-based resin, an epoxy-based resin, and the like.

The lower electrode 290 may be disposed on the planarization layer 270. The lower electrode 290 may be connected to the drain electrode 230 through a contact hole formed by removing a part of the planarization layer 270, and the lower electrode 290 may be electrically connected to the semiconductor element 250. The lower electrode 290 may include a metal, an alloy, metal nitride, conductive metal oxide, a transparent conductive material, and the like. These may be used alone or in combination with each other. In other exemplary embodiments, the lower electrode 290 may have a multilayer structure including a plurality of metal layers. For example, the metal layers may have mutually different thicknesses or may include mutually different materials.

The pixel defining layer 310 may be disposed on the planarization layer 270. For example, the pixel defining layer 310 may expose a part of a top surface of the lower electrode 290 while covering both sides of the lower electrode 290. The pixel defining layer 310 may be formed of an organic insulating material or an inorganic insulating material. In the exemplary embodiments, the pixel defining layer 310 may include an organic insulating material.

The light emitting layer 330 may be disposed on the pixel defining layer 310 and the lower electrode 290. The light emitting layer 330 may be formed by using at least one of light emitting materials configured to emit different color lights (i.e., red light, green light, blue light, etc.) according to pixels. Alternatively, the light emitting layer 330 may be formed by stacking a plurality of light emitting materials configured to generate different color lights such as red light, green light, and blue light to emit white light as a whole. In this case, a color filter may be disposed on the light emitting layer 330 which is disposed on the lower electrode 290. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed on the light emitting layer 330 and the pixel defining layer 310. The upper electrode 340 may include a metal, an alloy, metal nitride, conductive metal oxide, a transparent conductive material, and the like. These may be used alone or in combination with each other. In other exemplary embodiments, the upper electrode 340 may have a multilayer structure including a plurality of metal layers. For example, the metal layers may have mutually different thicknesses or may include mutually different materials.

The first inorganic thin film encapsulation layer 451 may be disposed on the upper electrode 340. The first inorganic thin film encapsulation layer 451 may be disposed along a profile of the upper electrode 340 with a uniform thickness to cover the upper electrode 340. The first inorganic thin film encapsulation layer 451 may prevent the light emitting layer 330 from being deteriorated due to penetration of moisture, oxygen, or the like. In addition, the first inorganic thin film encapsulation layer 451 may function to protect the display panel 200 from an external impact. The first inorganic thin film encapsulation layer 451 may include an inorganic insulating material having flexibility.

The organic thin film encapsulation layer 452 may be disposed on the first inorganic thin film encapsulation layer 451. The organic thin film encapsulation layer 452 may improve flatness of the display panel 200, and may protect the display panel 200. The organic thin film encapsulation layer 452 may include an organic insulating material having flexibility.

The second inorganic thin film encapsulation layer 453 may be disposed on the organic thin film encapsulation layer 452. The second inorganic thin film encapsulation layer 453 may be disposed along a profile of the organic thin film encapsulation layer 452 with a uniform thickness to cover the organic thin film encapsulation layer 452. The second inorganic thin film encapsulation layer 453 may prevent the light emitting layer 330 from being deteriorated due to the penetration of moisture, oxygen, or the like together with the first inorganic thin film encapsulation layer 451. In addition, the second inorganic thin film encapsulation layer 453 may function to protect the display panel 200 from an external impact together with the first inorganic thin film encapsulation layer 451 and the organic thin film encapsulation layer 452. The second inorganic thin film encapsulation layer 453 may include an inorganic insulating material having flexibility.

Accordingly, the display panel 200 including the substrate 110, the semiconductor element 250, the planarization layer 270, the lower electrode 290, the pixel defining layer 310, the light emitting layer 330, the upper electrode 340, the first inorganic thin film encapsulation layer 451, the organic thin film encapsulation layer 452, and the second inorganic thin film encapsulation layer 453 may be provided.

Although the display device 100 according to the present invention has been described as being an organic light emitting diode display device, the configuration of the present invention is not limited thereto. In other exemplary embodiments, the display device 100 may include a liquid crystal display device (LCD), a field emission display device (FED), a plasma display device (PDP), or an electrophoretic image display device (EPD).

Figure 11:
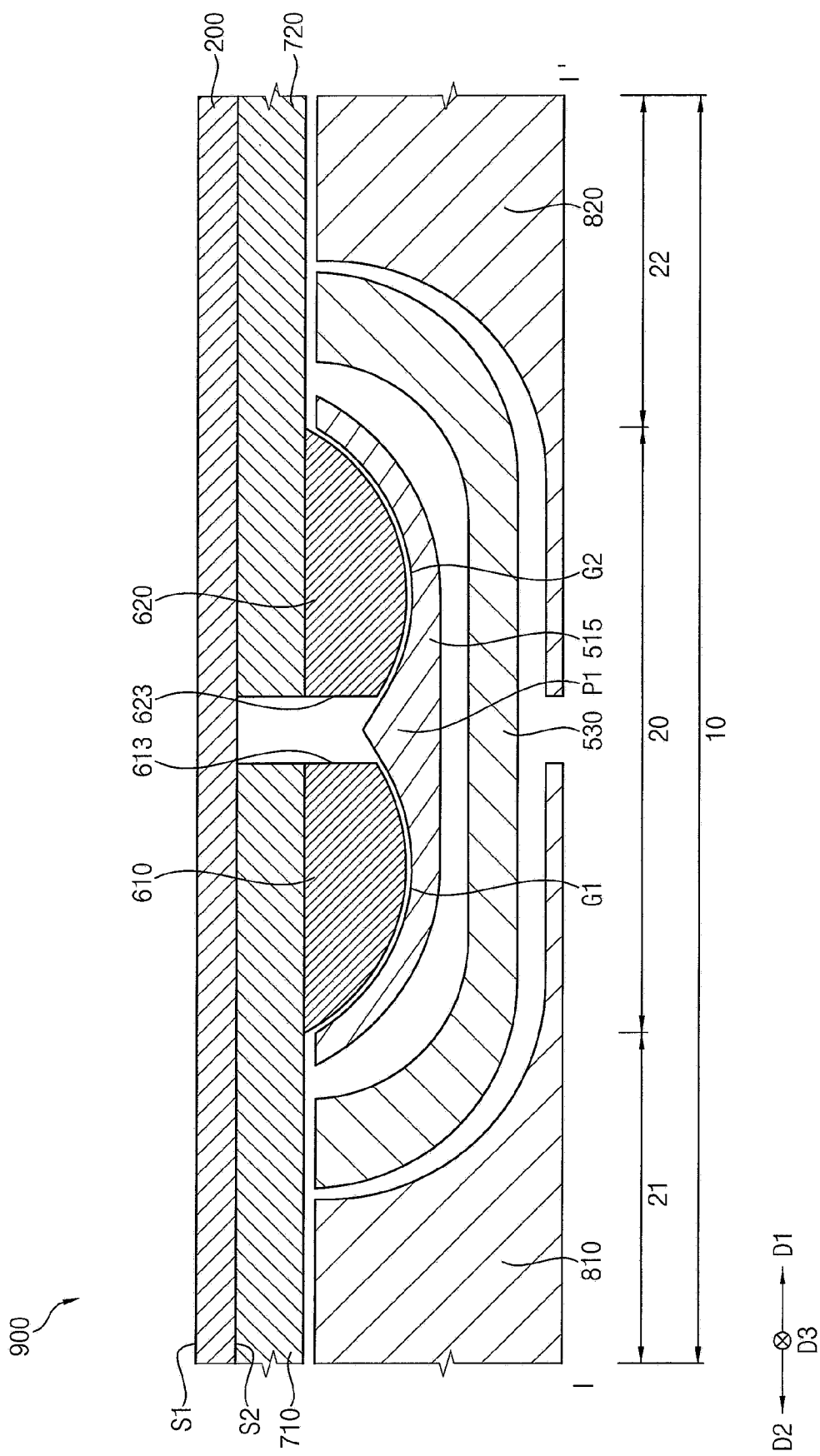
FIG. 11 is a cross-sectional view illustrating a display device according to exemplary embodiments of the present invention.

FIG. 11 is a cross-sectional view illustrating a display device according to exemplary embodiments of the present invention. A display device 900 illustrated in FIG. 11 may have a configuration substantially identical or similar to the configuration of the display device 100 described with reference to FIGS. 1 to 10 except for a shape of a hinge member 515. In FIG. 11, redundant descriptions of components substantially identical or similar to the components described with reference to FIGS. 1 to 10 will be omitted. For example, FIG. 11 illustrates a state in which the display device 900 is unfolded.

Referring to FIG. 11, the display device 900 may include a display panel 200, a first metal member 710, a second metal member 720, a first blocking member 610, a second blocking member 620, a hinge member 515, a hinge cover member 530, a first lower cover member 810, and a second lower cover member 820.

The hinge member 515 may overlap the foldable area 20 in the direction D1-D2 extending on the bottom surface of the first metal member 710 and the bottom surface of the second metal member 720. The hinge member 515 may include first and second grooves G1 and G2 recessed in the direction from the display panel 200 to the hinge cover member 530. For example, the hinge member 515 may include the first curved portion 511 having the first curvature and the second curved portion 512 having the first curvature, and the first curved portion 511 and the second curved portion 512 may be consecutively located. That is, the first curved portion 511 and the second curved portion 512 may be integrally formed, and the first and second grooves G1 and G2 of the hinge member 515 may be respectively defined by the first curved portion 511 and the second curved portion 512. In the exemplary embodiments, when the display panel 200 is unfolded, a protrusion P1 defined by the first and second grooves of the hinge member 515 may be located in a separation space between the first blocking member 610 and the second blocking member 620 in the foldable area 20 (e.g., a space between the third surface 613 and the sixth surface 623). The protrusion P1 may supply additional blockage to debris entering the grooved space formed by the hinge member 515 to prevent debris and other foreign contaminants from reaching the display panel 200.

The present invention may be applied to various electronic devices including a display device. For example, the present invention may be applied to vehicle-display device, a ship-display device, an aircraft-display device, portable communication devices, display devices for display or for information transfer, a medical-display device, etc The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A display device comprising:
   a display panel configured to be folded including a foldable area;
   a first metal member disposed in a first portion on a bottom surface of the display panel;
   a second metal member disposed in a second portion on the bottom surface of the display panel, the second metal member being spaced apart from the first metal member in a first direction;
   a hinge member overlapping the foldable area on a bottom surface of each of the first metal member and the second metal member, the hinge member including a first curved portion having a first curvature and a second curved portion spaced apart from the first curved portion and having the first curvature; and
   a first blocking member disposed between the bottom surface of the first metal member and the first curved portion of the hinge member, the first blocking member including a first surface having the first curvature, a second surface facing the bottom surface of the first metal member, and a third surface located between the first surface and the second surface; and
   a second blocking member disposed between a bottom surface of the second metal member and the second curved portion of the hinge member, the second blocking member including a fourth surface having the first curvature, a fifth surface facing the bottom surface of the second metal member, and a sixth surface located between the fourth surface and the fifth surface, the second blocking member being spaced apart from the first blocking member in the first direction,
   wherein when the display panel is unfolded, the third surface faces the sixth surface, and an empty space exists between the third surface and the sixth surface.

2. The display device of claim 1, wherein the hinge member includes a groove recessed in a direction from the display panel to the first blocking member, and
   a part of the groove is defined as the first curved portion.

3. The display device of claim 2, wherein when the display panel is unfolded, the first curved portion faces the first surface of the first blocking member.

4. The display device of claim 2, comprising:
a first virtual concentric circle having the first curvature and corresponding to the first surface, wherein a center of the first virtual concentric circle is defined as a first rotation axis, and wherein
the first metal member and the first blocking member rotate about the first rotation axis.

5. The display device of claim 4, wherein the first rotation axis is located on a neutral plane of the display panel.

6. The display device of claim 4, wherein when the display panel is unfolded and folded, a width of the first blocking member is within a width of the hinge member.

7. The display device of claim 1, wherein when the display panel is folded, the third surface faces the first curved portion.

8. The display device of claim 7, wherein the third surface is located inside the groove.

9. The display device of claim 1, further comprising: a protrusion provided at a location where the first and second curved portions meet, the protrusion extending upwards in a direction towards the first and second metal members.

10. The display device of claim 9,
wherein the protrusion is positioned directly below where the first and second metal members are spaced apart from each other.

11. The display device of claim 1, wherein when the display panel is unfolded, the second curved portion faces the fourth surface of the second blocking member.

12. The display device of claim 1, wherein a second virtual concentric circle having the first curvature and corresponding to the fourth surface is defined,
a center of the second virtual concentric circle is defined as a second rotation axis, and
the second metal member and the second blocking member rotate about the second rotation axis.

13. The display device of claim 12, wherein the second rotation axis is located on a neutral plane of the display panel.

14. The display device of claim 12, wherein the first virtual concentric circle partially overlaps the second virtual concentric circle.

15. The display device of claim 1, wherein
when the display panel is folded, the sixth surface faces the second curved portion.

16. The display device of claim 1, wherein the first blocking member and the second blocking member are located symmetrically to each other in the foldable area.

17. The display device of claim 1, wherein the display panel further includes a display area, and
a part of the display area is defined as the foldable area.

* * * * *